(12) United States Patent
Tomishima et al.

(10) Patent No.: US 9,804,793 B2
(45) Date of Patent: Oct. 31, 2017

(54) TECHNIQUES FOR A WRITE ZERO OPERATION

(71) Applicant: Intel Corporation, Santa Clara, CA (US)

(72) Inventors: Shigeki Tomishima, Portland, OR (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/277,182

(22) Filed: Sep. 27, 2016

(65) Prior Publication Data

US 2017/0255406 A1 Sep. 7, 2017

Related U.S. Application Data

(60) Provisional application No. 62/303,662, filed on Mar. 4, 2016.

(51) Int. Cl.
*G11C 7/00* (2006.01)
*G06F 3/06* (2006.01)

(52) U.S. Cl.
CPC ............ *G06F 3/0619* (2013.01); *G06F 3/068* (2013.01); *G06F 3/0659* (2013.01)

(58) Field of Classification Search
CPC ........... G11C 7/1006; G11C 8/04; G11C 7/10; G11C 7/1012
See application file for complete search history.

(56) References Cited

U.S. PATENT DOCUMENTS

| | | | |
|---|---|---|---|
| 5,381,368 A | 1/1995 | Morgan et al. | |
| 5,440,517 A | 8/1995 | Morgan et al. | |
| 5,625,601 A | 4/1997 | Gillingham et al. | |
| 5,854,771 A | 12/1998 | Mori | |
| 5,886,944 A | 3/1999 | Ahn | |
| 5,956,285 A * | 9/1999 | Watanabe | G11C 7/1006 365/196 |
| 6,130,852 A * | 10/2000 | Ohtani | G11C 7/103 365/189.08 |
| 6,289,413 B1 | 9/2001 | Rogers et al. | |
| 6,337,832 B1 * | 1/2002 | Ooishi | G11C 7/1072 365/219 |
| 6,449,204 B1 | 9/2002 | Arimoto et al. | |
| 9,001,607 B2 * | 4/2015 | Ong | G11C 7/222 365/219 |
| 2001/0008498 A1 | 7/2001 | Ooishi | |
| 2006/0233013 A1 | 10/2006 | Tu et al. | |

(Continued)

OTHER PUBLICATIONS

International Search Report and Written Opinion received for International Patent Application No. PCT/US2016/017226, mailed on Jun. 3, 2016, 12 pages.

(Continued)

*Primary Examiner* — Tuan T Nguyen
(74) *Attorney, Agent, or Firm* — Compass IP Law PC

(57) ABSTRACT

Examples include techniques for a write zero operation. Example techniques include forwarding a write 0 command to a memory device to cause internal activations of column select lines of one or more blocks of memory to cause bit values or contents of the one or more blocks to have or store a value of 0.

25 Claims, 11 Drawing Sheets

Memory Device 100

(56) References Cited

U.S. PATENT DOCUMENTS

| | | | |
|---|---|---|---|
| 2007/0147160 A1* | 6/2007 | Hanzawa | G11C 7/1012 365/230.03 |
| 2010/0091538 A1* | 4/2010 | Kim | G06F 13/4234 365/51 |
| 2010/0149894 A1 | 6/2010 | Mochida et al. | |
| 2010/0157693 A1 | 6/2010 | Iwai et al. | |
| 2011/0007583 A1* | 1/2011 | Lee | G11C 7/062 365/189.17 |
| 2014/0059285 A1 | 2/2014 | Kim et al. | |
| 2014/0173234 A1 | 6/2014 | Jung et al. | |
| 2014/0177347 A1 | 6/2014 | Chatterjee et al. | |
| 2016/0284390 A1 | 9/2016 | Tomishima et al. | |

OTHER PUBLICATIONS

Vivek Seshadri, et al., "RowClone: Fast and Energy-Efficient In-DRAM Bulk Data Copy and Initialization" Micro-46 Proceeding of the 46th Institute of Electrical and Electronics Engineers Annual Association for Computing Machinery (ACM) IEEE/ACM International Symposium Microarchitecture, 13 pages (Published Dec. 7, 2013).

* cited by examiner

800

```
FORWARD, AT A CONTROLLER FOR A MEMORY DEVICE, A WRITE 0
COMMAND TO CAUSE ALL BIT VALUES IN A BLOCK OF MEMORY OF
THE MEMORY DEVICE TO HAVE A VALUE OF 0
802
```

```
CAUSE ALL GIOs TO THE BLOCK OF MEMORY TO HAVE A GIO VALUE
OF 0
804
```

```
CAUSE AN INTERNAL ACTIVATION OF ALL CSLs TO THE BLOCK OF
MEMORY BY THE MEMORY DEVICE, THE INTERNAL ACTIVATION OF
ALL CSLs TO CAUSE THE GIO VALUE OF 0 TO BE WRITTEN TO A FIRST
PORTION OF THE BLOCK OF MEMORY BEFORE A WRITE LINE IS
INTERNALLY ACTIVATED BY THE MEMORY DEVICE
806
```

FORWARD AT A CONTROLLER FOR A MEMORY DEVICE, A WRITE 0 COMMAND TO CAUSE ONE OR MORE BLOCKS OF MEMORY FOR THE MEMORY DEVICE TO STORE A VALUE OF 0
902

CAUSE INTERNAL ACTIVATION OF CSLs TO THE ONE OR MORE BLOCKS OF MEMORY BY THE MEMORY DEVICE, THE INTERNAL ACTIVATION OF THE CSLs TO OCCUR IN A SEQUENTIAL MANNER UNTIL ALL COLUMNS OF THE ONE OR MORE BLOCKS OF MEMORY HAVE BEEN ACTIVATED AND THE ONE OR MORE BLOCKS OF MEMORY STORE THE VALUE OF 0
904

*FIG. 9*

TECHNIQUES FOR A WRITE ZERO OPERATION

RELATED CASE

This application claims priority to U.S. Provisional Patent Application No. 62/303,662 filed on Mar. 4, 2016 that is hereby both incorporated by reference in its entirety.

TECHNICAL FIELD

Examples described herein are generally related to techniques for write operations to a memory device.

BACKGROUND

Contents of blocks of memory for a memory device may be zeroed to cause binary values or content maintained in the block of memory to have a value of 0. Each block of memory may be a memory page including 4 kilobytes (KB) of data. In some examples, graphics intensive applications or memory rich processor platforms may have a need to zero contents of one or more blocks of memory as quickly as possible. Graphics intensive applications may require fast zeroing to quickly change areas of a display to black that would need one or more blocks of memory associated with the areas to be zeroed. Memory rich processor platforms may require fast zeroing for error correction coding (ECC) initialization or calibration that may require contents of one or more blocks of memory to have an initial value of 0.

BRIEF DESCRIPTION OF THE DRAWINGS

FIG. 8 illustrates an example of a first logic flow.
FIG. 9 illustrates an example of a second logic flow.

DETAILED DESCRIPTION

As contemplated in the present disclosure, in some examples, graphics intensive applications or memory rich processor platforms may have a need to zero contents of one or more blocks of memory as quickly as possible. Software-based solutions may be used by a software programmer such as "Memset(ptr, o, nbyte)" or "calloc( )" to set a high-level function to zero contents of a block of memory. These software-based, high-level functions may be compiled into a loop of stored instructions. For example, with advanced vector extension (AVX) it may be possible to clear or zero contents of 256 bits (b) of memory at a time using a single instruction. However, to zero contents of an entire page of memory that may be 4 kilobytes (KB), the single instruction would have to execute or loop 128 times.

Some solutions have been developed to move away from software-based, high-level functions to quickly zero contents of blocks of memory. A first solution was a WRITE0 command that caused all column select lines (CSLs) of a block of memory to write 0 in an efficient and fast manner. However, the access protocol for the WRITE0 command was based on commodity access protocols for dynamic random access (DRAM) (e.g., JEDEC standard protocols) such as activate (ACT) and WRITE0 commands. These commodity access protocols add significant command traffic to a command/command address (CA) bus and a data (DQ) bus for a memory device.

A second solution introduced a new command, W0ACT. The new W0ACT command would cause contents of an entire page or block of memory to be zeroed in a similar manner as the first solution by activating all CSLs in an efficient and fast manner but doing so with a single write command on the command/CA bus. Activating all CSLs may cause high peak current. This may be problematic in some systems that have limited available power (e.g., a mobile computing device) or may lack adequate power circuitry to handle the high peak current needed to activate all CSLs. It is with respect to the above-mentioned and other challenges that the examples described herein are needed.

Figure 1:
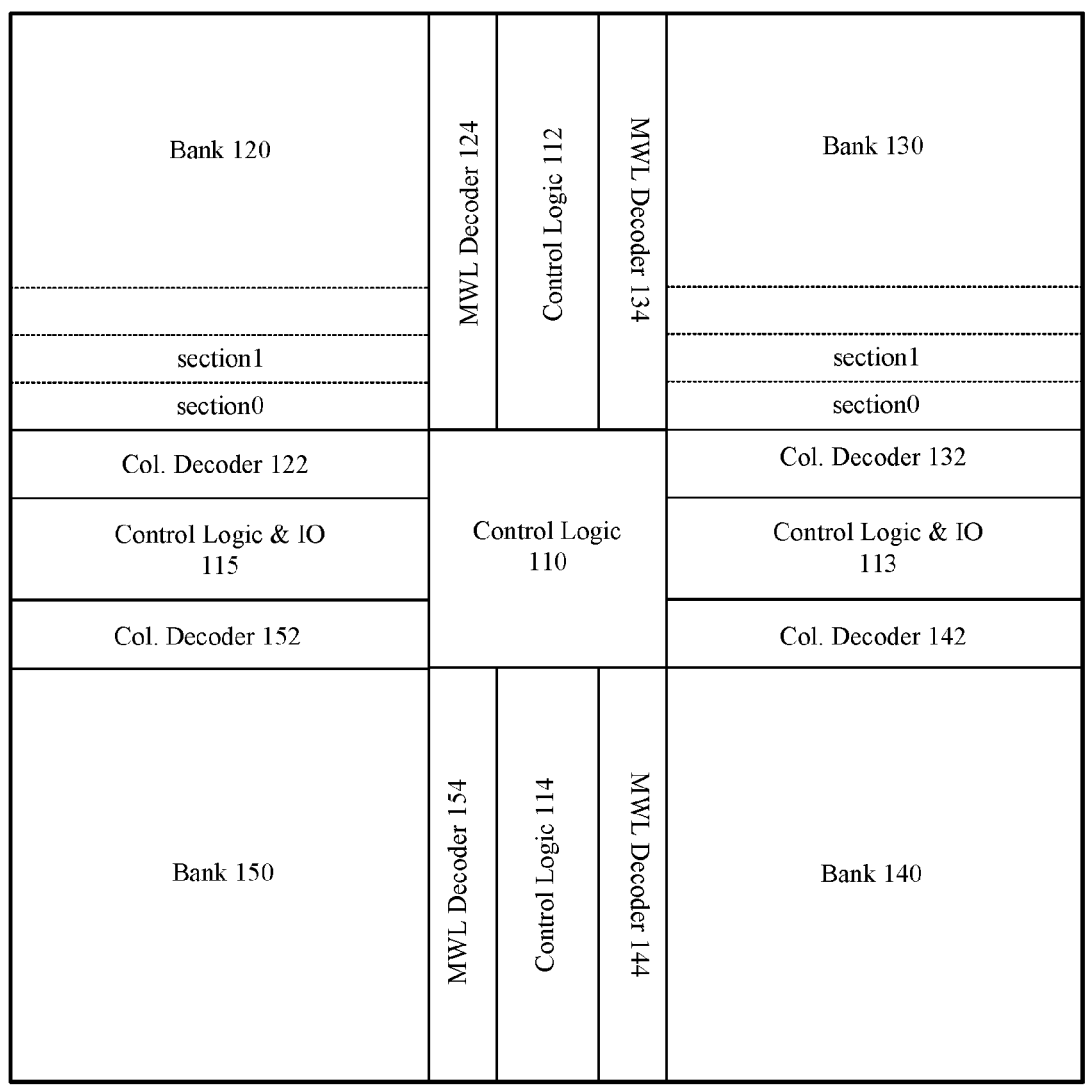
FIG. 1 illustrates an example memory array.

FIG. 1 illustrates an example memory array 100. In some examples, memory array 100 may be thought of as an array of memory bit cells organized in a two-dimensional fashion for a memory device. In order to access information, an address vector may be given to memory array 100 and a block of information may be retrieved. Memory array 100 may be divided into somewhat independent banks that are shown in FIG. 1 as banks 120, 130, 140 or 150. Bank address bits in the address vector may be used to select a bank from among banks 120, 130, 140 or 150. A given bank may be further divided into many sections. Access to the banks and their respective sections may be facilitated by logic, features and/or circuitry that may include a control logic 110 and various other logic, features and/or circuitry shown in FIG. 1 as control logic and input/output (IO) 113 and 115, control logic 112 and 114, column (col.) decoders 122, 132, 142 and 152 or main word line (MWL) decoders 124, 134, 144 and 154.

In some examples, sections of a same bank may share peripheral logic, features and/or circuitry. For example, section0 and section1 of bank 120 may share control logic and input/output (IO) 115, col decoder 122, MWL decoder 124 and control logic 112. According to some examples, at a given time only one section may be allowed to be active. A section may be further divided into many tiles (not shown) sometimes called sub-arrays. Address bits other than bank address bits in an address vector may be row address bits and column address bits. Row address bits may be used to select a section and a row within the selected section. A row in a section may have an equivalent of 16K to 64K bits (or 2K to 8K bytes) in a row. A row, in some examples, may also be called a page or memory page. Each bit in a row may have a corresponding sense amplifier (amp) which may be used to access content maintained in bit cells.

According to some examples, memory array 100 may include a type of volatile memory such as, but not limited to, DRAM. For these examples, DRAM bits cells may store information or content in a capacitor. Sense amps for each bit cell may be sensed through phases. First, a bit-line (and its complement) needs to be pre-charged to a certain voltage. Then a row may be enabled after a row address has been decoded. Charge (or lack of charge) in a bit cell may then be shared with the bit-line resulting in a small difference in voltage between the bit-line and its complement. At this time the sense amp may be enabled to amplify the voltage difference to determine content in the bit cell. Data stored in sense amps may then be further selected using a column address decoded from column address bits to go out of memory array 100 through 10 pins (not shown). Typically, a DRAM device may have 4 to 32 pins for data IO. The above actions may be initiated by a command and performed by the logic, features and/or circuitry mentioned above for memory array 100.

In some examples, a memory array 100 including DRAM memory may be arranged to operate according to various developed memory technologies that may include, but are not limited to, DDR4 (double data rate (DDR) version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), and/or other technologies based on derivatives or extensions of such specifications. Memory array 100 including DRAM memory may also be arranged to operate according to various memory technologies currently in development that may include, but are not limited to, DDR5 (DDR version 5, currently in discussion by JEDEC), LPDDR5 (LPDDR version 5, currently in discussion by JEDEC), HBM2 (HBM version 2, currently in discussion by JEDEC), and/or other new technologies based on derivatives or extensions of such specifications. For each of these developed or developing technologies and/or specifications commands may be coded using such command bits such as row address strobe (RAS#), column address strobe (CAS#) or write enable (WE#) to name a few.

In some examples, as briefly mentioned above, and described more below, a new command may be introduced or added to the various DRAM technologies or specifications to cause an entire page or block of memory to be zeroed via use of a single command. This single command may be referred to as a W0ACT Command. Various internal operations for a memory device may be modified or modifiable to enable content in the block of memory to be zeroed such that a balance may be maintained between how quickly the block of memory may be zeroed and reducing or minimizing high peak current. As described herein, a block of memory may be zeroed to have or store a value of "0". Having or storing a value of "0" may be equivalent to a logical data "0" as even though logical data may be "0", physical data at memory cells can be a "data 1" or 'data 0" depending on which row address and a connection to a bit line (BL) or/BL.

Although example types of memory included in memory array 100 have been described as including volatile types of memory such as DRAM, this disclosure is not limited to DRAM. In some examples other volatile types of memory including, but not limited to, double data rate synchronous dynamic RAM (DDR SDRAM), static random-access memory (SRAM), Thyristor RAM (T-RAM) or zero-capacitor RAM (Z-RAM) are contemplated by this disclosure. Also, block addressable non-volatile types of memory, such as those associated with NAND or NOR technologies are contemplated by this disclosure. Also, other non-volatile types of memory such as 3-D cross-point memory that are byte addressable are contemplated by this disclosure. These block addressable or byte addressable non-volatile types of memory may include, but are not limited to, non-volatile types of memory that use chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

Figure 2:
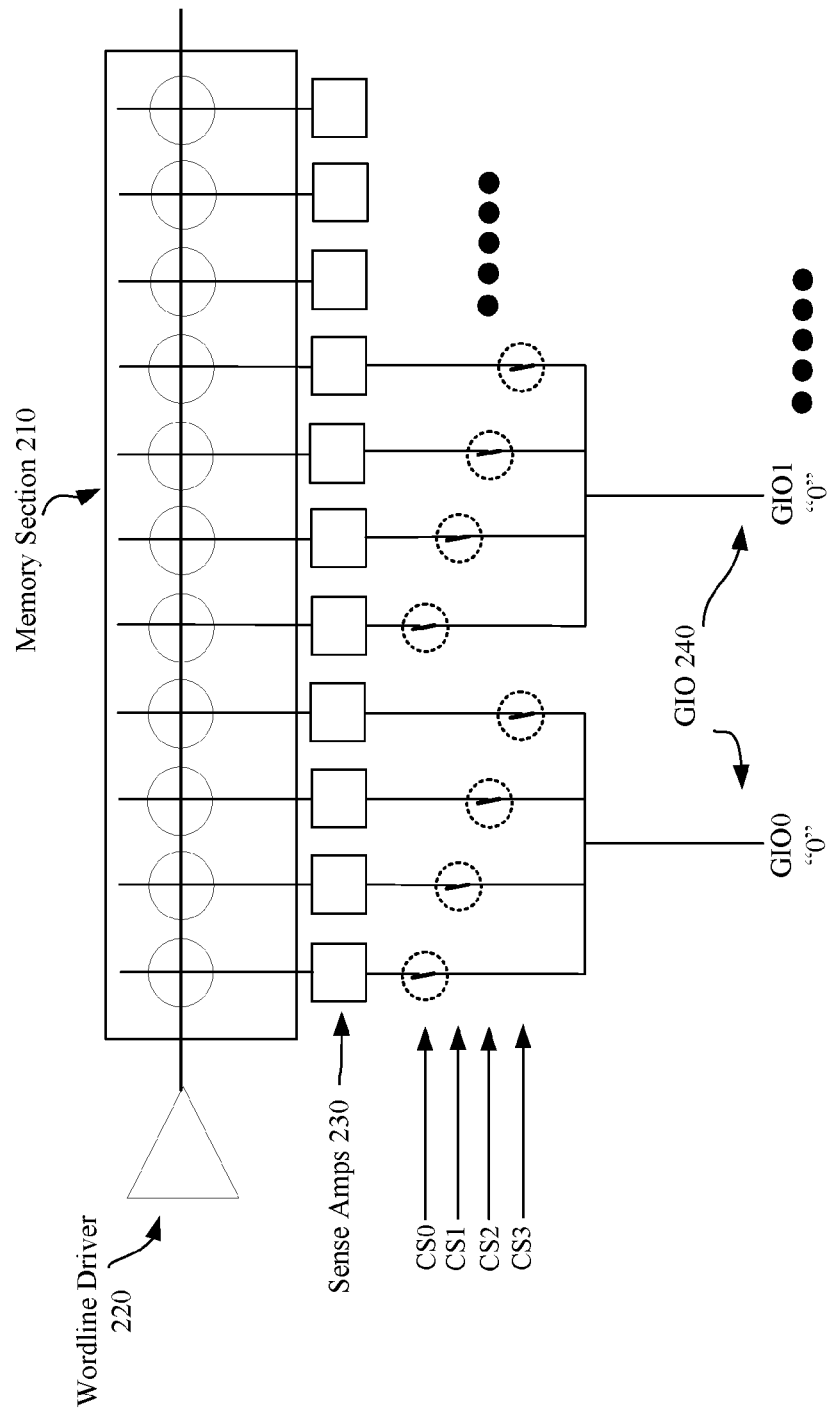
FIG. 2 illustrates an example system.

FIG. 2 illustrates an example system 200. In some examples, system 200 as shown in FIG. 2, includes a memory section 210, a wordline driver 220, sense amps 230 and global input/output (GIO) 240. For these examples, memory section 210, wordline driver 220, sense amps 230 and GIO 240 may represent a portion of internal circuitry of a memory device that may be activated in response to a W0ACT command having a row address associated with memory section 210. The W0ACT command may be forwarded (e.g., by a memory controller) to a memory device including system 200. The W0ACT command may cause contents of a block of memory to have a value of "0" via an internal write operation.

In some examples, all write drivers (not shown) may force "data 0" to GIOs included in GIO 240 (also force "Data 1" for/GIO—not shown in FIG. 2) for the block of memory to be zeroed. CSLs activated via CS0 to CS4 as shown by the closed switches for GIO 240 to sense amps 230 may be selectively activated and/or have internal timing to reduce or minimize high peak current.

Figure 3:
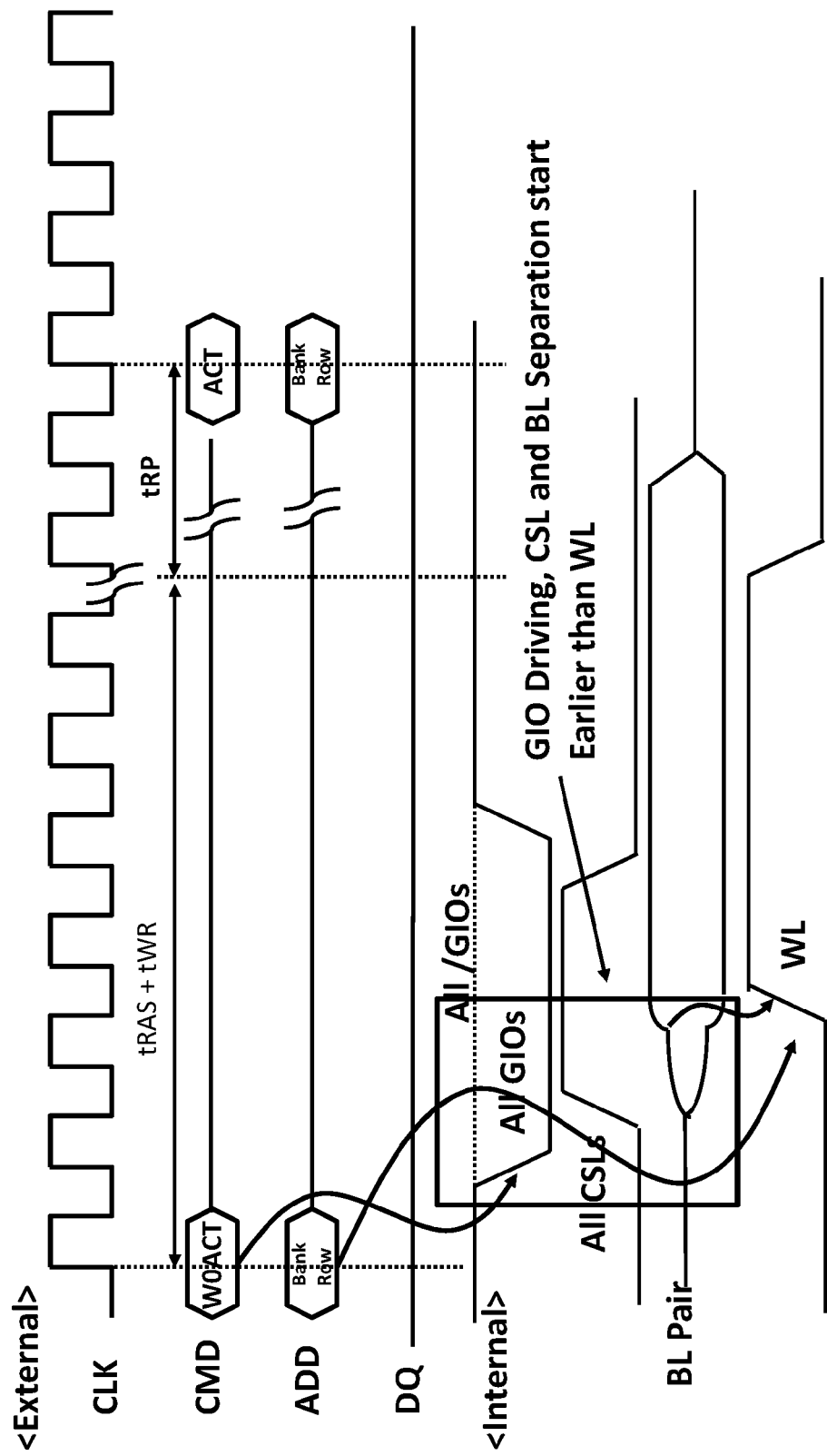
FIG. 3 illustrates an example first timing diagram.

FIG. 3 illustrates an example timing diagram 300. In some examples, timing diagram 300 as shown in FIG. 3 depicts external/internal timing for a memory device responsive to receiving a W0ACT command. The W0ACT command may have been forwarded to the memory device to cause contents of a block of memory for the memory device to have a value of 0. For these examples, at least some elements of system 200 shown in FIG. 2 may be used to describe internal actions taken in response to the W0ACT command. Examples are not limited to elements of system 200 for timing diagram 300.

According to some examples, <External> portions of timing diagram 300 include a clock signal (CLK), a command (CMD) signal, an address (ADD) signal and a data signal (DQ) and these <External> portions represent signals received by circuitry of a memory device or memory array and relative timing for these signals in relation to the CLK signal. For these examples, <Internal> portions of timing diagram 300 indicate timing for actions for an automatic internal write operation implemented via GIO, /GIO, CSL, bit line (BL) pair and write line (WL).

In some examples, timing diagram 300 may depict an "Early Write" operation for system 200 that sends or drives "data 0" to all GIOs included in GIOs 240 and "data 1" to/GIOs also included in GIOs 240. The Early Write operation may also cause activation of all CSLs before WL is activated for memory section 210. This "Early Write" approach may have lower peak current compared to first activating the WL followed by sending "data 0" to all GIOs and activating all CSLs. The lower peak current may be due to "Early Write" not needing a large drive strength or high peak current between sense amps 230 and write driver 220 as per a normal or usual write operation for memory section 210. Since BL PAIR indicates sense amps 230 may still be in a floating status before sense amp or WL activation. Therefore, after a relatively small BL voltage split happens, sense amps 230 may be activated and amplified, then by the time of WL activation of memory section 210, Write data to zero content may be stored to the memory cells included in memory section 210. According to some examples, "tRAS+ tWR" in timing diagram 300 indicates row access and write recover times for the internal actions and "tRP" indicates row precharge time following the Early Write operation via which an ACT command for memory section 210 may be implemented.

Figure 4:
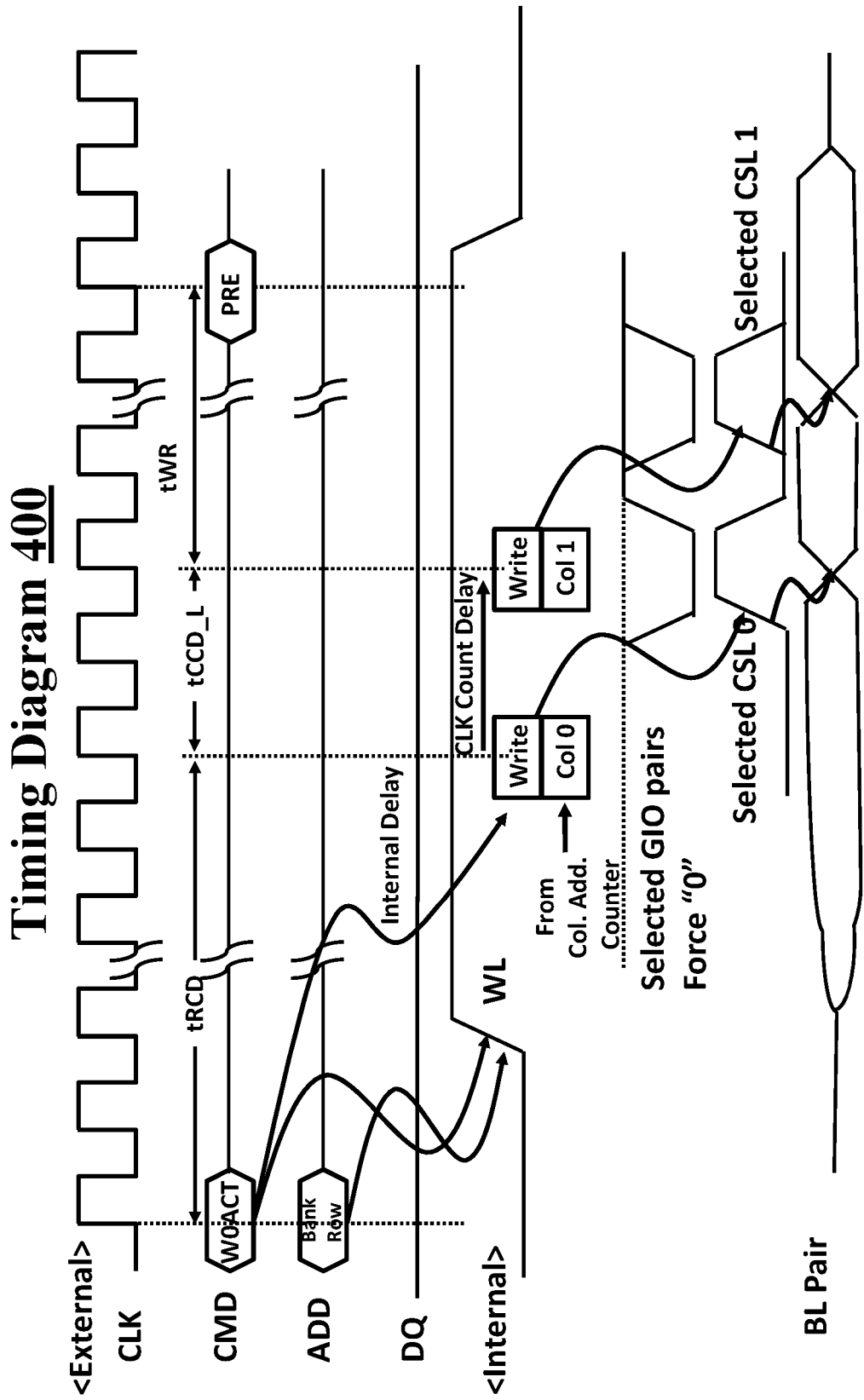
FIG. 4 illustrates an example second timing diagram.

FIG. 4 illustrates an example timing diagram 400. In some examples, timing diagram 400 as shown in FIG. 4 depicts external/internal timing for a memory device responsive to receiving a W0ACT command. Similar to timing diagram 300 in FIG. 3, the W0ACT command may have been forwarded to the memory device or memory array to cause contents of a block of memory for the memory device to have a value of 0. Also similar to timing diagram 300, at least some elements of system 200 shown in FIG. 2 may be used to describe internal actions taken in response to the W0ACT command. Examples are not limited to elements of system 200 for timing diagram 400.

According to some examples, <External> portions of timing diagram 400 include CLK, CMD, ADD, DQ signals and these <External> portions represent signals received by circuitry of a memory device and relative timing for these signals in relation to the CLK signal. For these examples, <Internal> portions of timing diagram 400 indicate timing for actions for an automatic internal write operation implemented via a WL, selected GIO pairs, selected CSLs and a BL pair.

In some examples, timing diagram 400 may depict an internal column burst write operation for system 200 responsive to a received W0ACT command. For these examples, rather than implement an Early write operation, the WL for memory section 210 is activated first and each CSL for columns of memory section 210 may be activated sequentially in a manner similar to a regular Burst operation. As shown in FIG. 4, a first selected GIO pair may force a value of "0" (e.g., "data 0") and activation of CSL 0 may cause contents of col 0 to be written to a value of 0 followed by a second selected GIO pair forcing a value of "0" and activation of CSL 1 to cause contents of col 1 to be written to a value of 0. According to some examples, "tRCD" in timing diagram 400 indicates row activation to column activation time, "tCCD_L" indicates column to column delay for columns in a single bank and "tWR" indicates write recover time following the last column of a memory row being written to.

According to some examples, the approach of sequentially activating CSLs like a regular Burst operation may reduce or eliminate concerns of a large or high peak current consumption.

Figure 5:
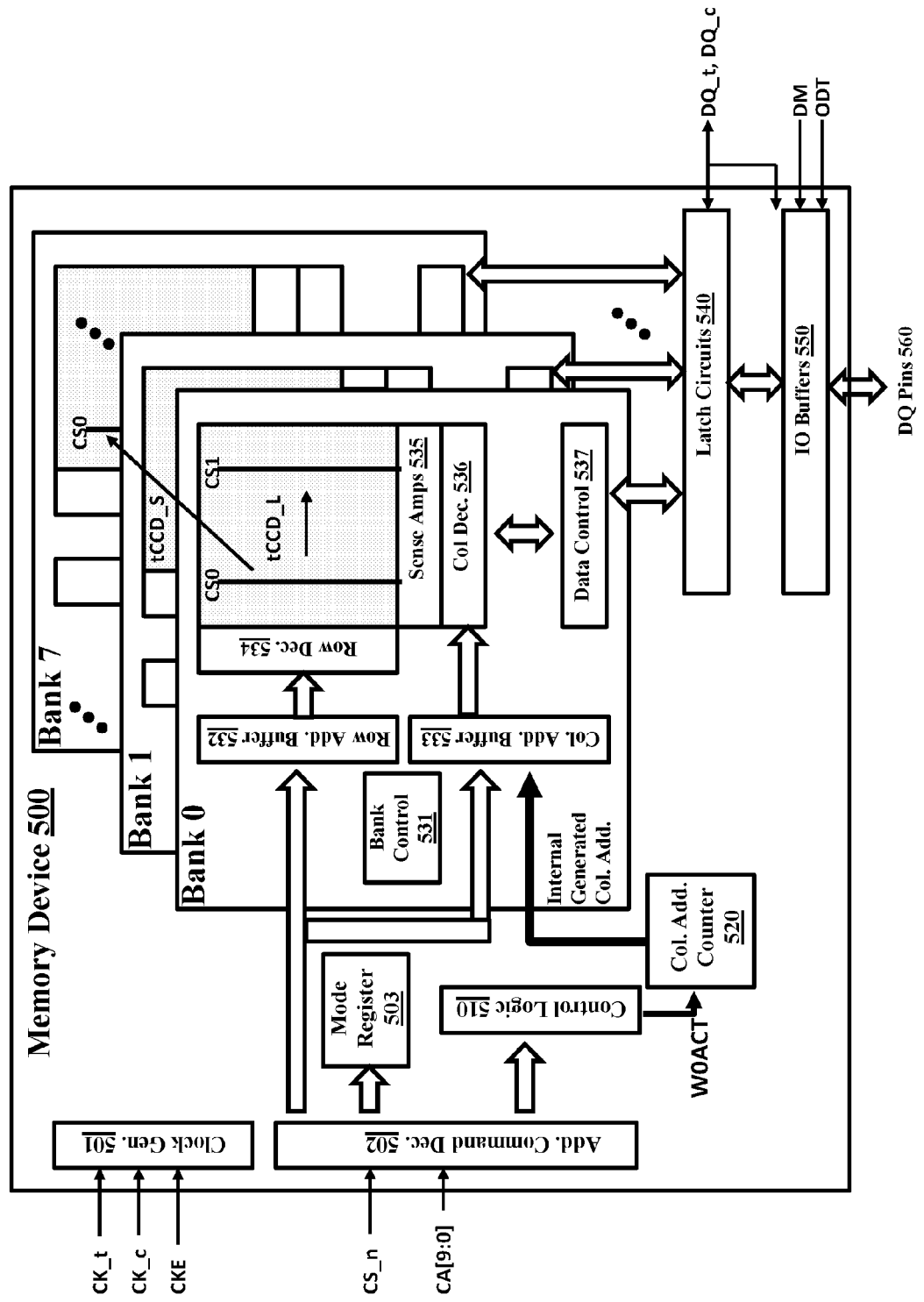
FIG. 5 illustrates an example second memory device.

FIG. 5 illustrates an example memory device 500. In some examples, as shown in FIG. 5, memory device 500 includes various logic, features or circuits to access banks 0 to 7 responsive to received commands. For example, memory device 500 may include peripheral circuitry to access banks 0-7 that includes a clock generator 501, an address command decoder 502, a mode register 503, a control logic 510, a column address counter 520, latch circuits 540, IO buffers 550 or DQ pins 560. Also, each bank of banks 0 to 7 may separately include a bank control 531, a row address buffer 532, a column address buffer 533, a row decoder 534, sense amps 535, a column decoder 536 or data control 537.

According to some examples, control logic 510 may include logic and/or features capable of generating or forwarding a W0ACT command to cause contents of a block of memory for memory device 500 to have a value of 0. For these examples, the W0ACT command may cause column address counter 520 to generate sequential column addresses for an internal Burst write 0 operation as shown and described for timing diagram 400. The generated sequential column addresses may be sent to respective column address buffer 533 for each of banks 0 to 7. Column address counter 520 may mimic, for example, a Row Address Refresh Counter (not shown) that may be used to refresh memory cells of memory device 500. A total operation time to complete the internal Burst write 0 operation may vary and depend on array organization for memory device 500 and the size of the block of memory or memory page.

Figure 6:
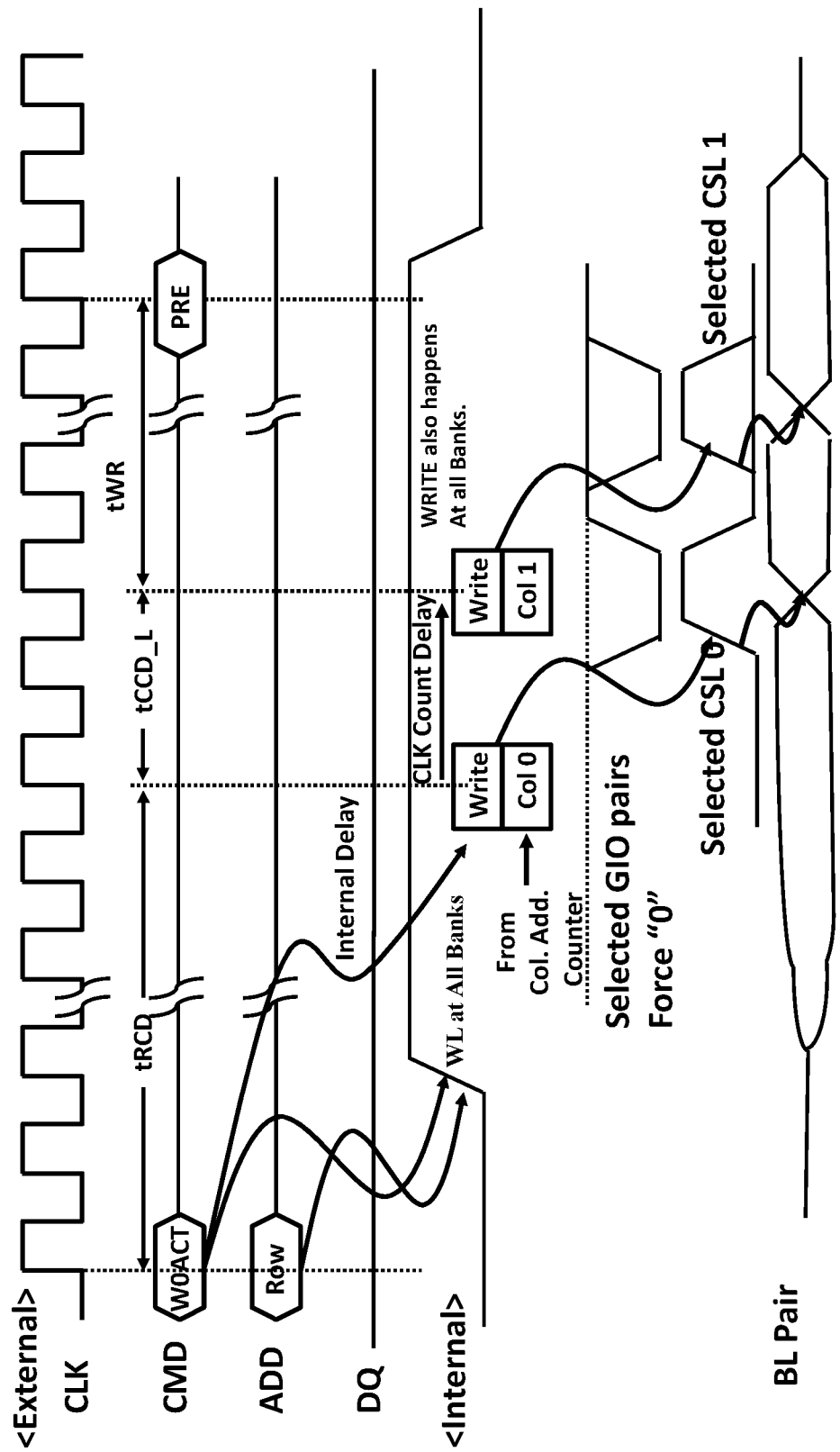
FIG. 6 illustrates an example third timing diagram.

FIG. 6 illustrates an example timing diagram 600. In some examples, timing diagram 600 as shown in FIG. 6 depicts external/internal timing for a memory device or memory array responsive to receiving a W0ACT command. Similar to timing diagrams 300 and 400 in FIGS. 3 and 4, the W0ACT command may have been forwarded to the memory device to cause contents of a block of memory for the memory device to have a value of 0. At least some elements of system 200 shown in FIG. 2 or elements of system 500 shown in FIG. 5 may be used to describe internal actions taken in response to the W0ACT command. Examples are not limited to elements of system 200 or 500 for timing diagram 600.

According to some examples, <External> portions of timing diagram 600 include CLK, CMD, ADD, DQ signals and these <External> portions represent signals received by circuitry of a memory device and relative timing for these signals in relation to the CLK signal. For these examples, <Internal> portions of timing diagram 600 indicate timing for actions for an automatic internal write operation implemented via a WL, selected GIO pairs, selected CSLs and a BL pair.

In some examples, timing diagram 600 is similar to timing diagram 400. However, rather than depict internal actions by a single bank, actions by all banks are depicted. For these examples, rather than locating column address counter 520 with peripheral circuitry at memory device 500, separate column address counters 520 may be included with each bank of banks 0 to 7. As a result, an internal Burst write 0 operation for all banks may cause WLs for a given memory row to be activated for all banks substantially simultaneously and write 0 happens at all banks substantially simultaneously for each column of the memory row indicated with the W0ACT command via the ADD signal. Also, since all banks are activated substantially simultaneously, only a row address is needed with the W0ACT command as shown in FIG. 6.

In some examples, rather than causing write 0's to one WL for a memory row at a time as shown for timing diagram 400, multiple WLs may be caused in each bank. For example, if 2 WLs were activated a total operation time to complete an internal Burst write 0 operation for a given bank may be reduced by nearly 50%.

According to some examples, rather than causing sequential write 0's for each column for a memory row of a given bank as shown for timing diagram 400, multiple CSLs may be activated simultaneously or at the same clock cycle. For example, CSLs for col 0 and col 1 of memory section 210 may be activated at a first same clock cycle and then CSLs for col 2 and col 3 may be activated at a second same clock cycle. Activating 2 CSLs at a time may also reduce total operation time to complete an internal Burst write 0 operation for a given bank by nearly 50%.

In some examples, if internal or external power supply circuitry of a memory device allows, a combination of multiple WL activations, multiple CSLs and multiple banks may be implemented for an internal Burst write 0 operation. These combinations may attempt to balance internal or external power supply circuitry limits with desired total operation times to complete an internal Burst write 0 operation. For example, a high resolution display for a mobile computing device such as a tablet or smart phone may need relatively fast operation times to complete Burst write 0 operations to support graphics intensive games or other types of applications. Heat dissipation capabilities of a small form factor and/or power supply limits imposed by a battery may be some limitations that may restrict how much the total operation time to complete internal Burst write operations can be reduced via the above-mentioned combinations.

Figure 7:
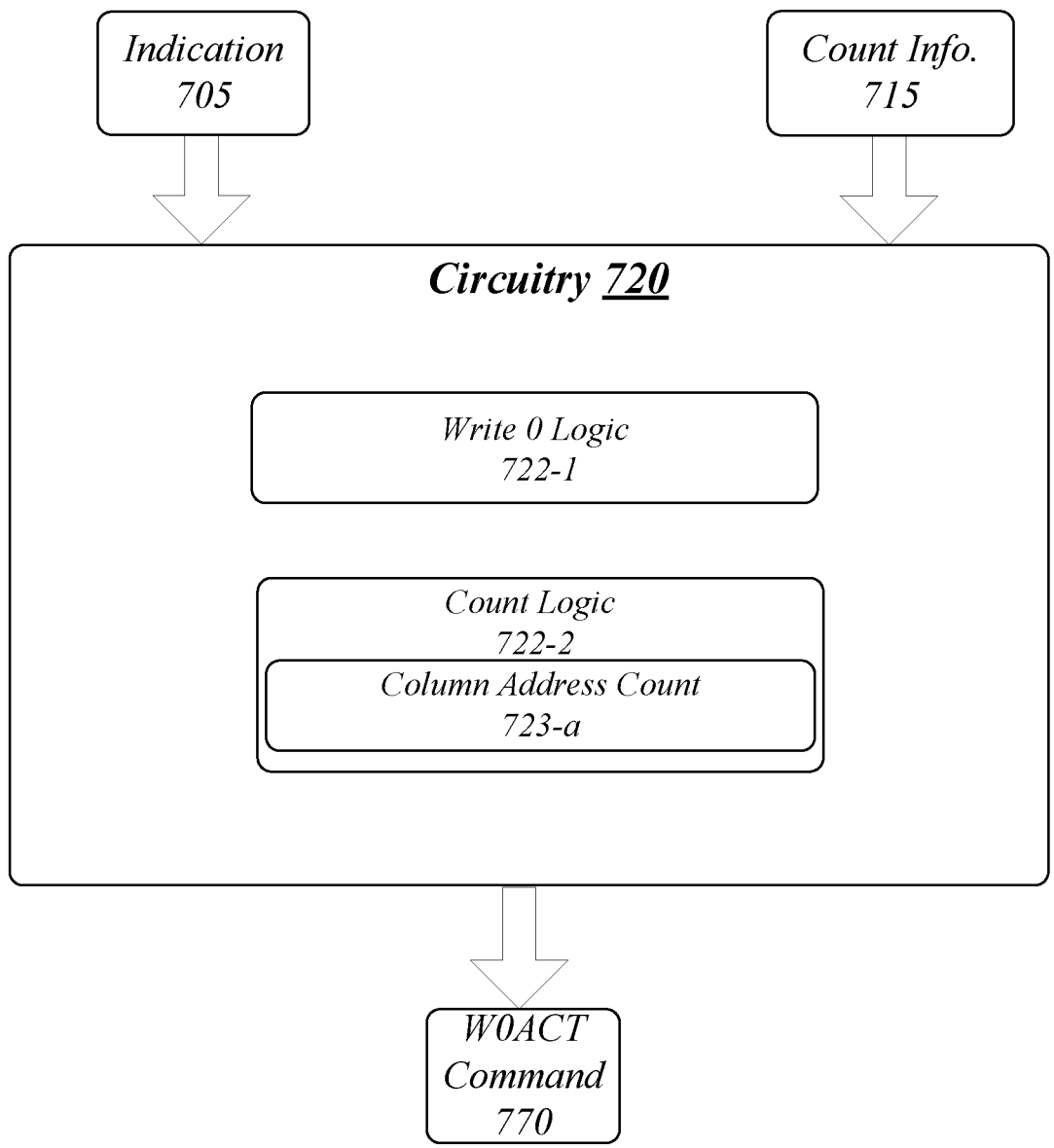
FIG. 7 illustrates an example block diagram for an apparatus.

FIG. 7 illustrates an example block diagram for an apparatus 700. Although apparatus 700 shown in FIG. 7 has a limited number of elements in a certain topology, it may be appreciated that the apparatus 700 may include more or less elements in alternate topologies as desired for a given implementation.

The apparatus 700 may be supported by circuitry 720 and apparatus 700 may be a controller maintained at a memory device, memory array or memory system. The memory device may be coupled to a host computing platform. Circuitry 720 may be arranged to execute one or more software or firmware implemented components, modules or logic 722-*a* (e.g., implemented, at least in part, by a storage controller of a storage device). It is worthy to note that "a" and "b" and "c" and similar designators as used herein are intended to be variables representing any positive integer. Thus, for example, if an implementation sets a value for a=2, then a complete set of software or firmware for logic, components or modules 722-*a* may include logic 722-1 or 722-2. Also, at least a portion of "logic" may be software/firmware stored in computer-readable media, and although the logic is shown in FIG. 7 as discrete boxes, this does not limit logic to storage in distinct computer-readable media components (e.g., a separate memory, etc.).

According to some examples, circuitry 720 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 720 may also include one or more application-specific integrated circuits (ASICs) and at least some logic 722-*a* may be implemented as hardware elements of these ASICs.

According to some examples, apparatus 700 may include a write 0 logic 722-1. Write 0 logic 722-1 may be a logic and/or feature executed by circuitry 720 to forward a write 0 command to cause all bit values or contents of one or more blocks of memory for a memory device to have or store a value of 0. For these examples, the command may be a W0ACT command included in W0ACT command 770 that may be forwarded or issued by write 0 logic 722-1 to internal circuitry of the memory device responsive to an indication included in request 705 that indicates a need to complete a write 0 operation for the one or more blocks of memory. Indication 705, for example, may have been sent from an application executing at a host computing device or platform coupled with a memory device or system that includes apparatus 700.

In some examples, apparatus 700 may also include a count logic 722-2. Count logic 722-2 may be a logic and/or feature executed by circuitry 720 to use a column count of internally activated CSLs by the memory device for columns of the one or more blocks of memory to cause the internally activated CSLs to be activated in a sequential manner until all columns of the one or more block of memory have been activated and he one or more blocks of memory have or store the value of 0. For these examples, the one or more blocks of memory may be one or more banks and the activated CSLs may be rows associated with one or more memory pages included in the one or more banks. In some examples, count information 715 may include sequential count information (e.g., generated by column address counter). Count logic 722-1 may maintain the sequential count information with column address count 723-*a* (e.g., in a lookup table (LUT)) for use in causing the internally activated CSLs to be activated in a sequential manner.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates an example of a logic flow 800. Logic flow 800 may be representative of some or all of the operations executed by one or more logic, features, or devices described herein, such as apparatus 700. More particularly, logic flow 800 may be implemented by one or more of write 0 logic 722-1 or count logic 722-2.

According to some examples, logic flow 800 at block 802 may forward, at a controller for a memory device, a write 0 command to cause all bit values in a block of memory of the memory device to have a value of 0. For these examples, write 0 logic 722-1 may forward the command.

In some examples, logic flow 800 at block 804 may cause all GIOs to the block of memory to have a GIO value of 0. For these examples, the write 0 command forwarded by write0 logic 722-2 may automatically cause all the GIOs to have the GIO value of 0.

According to some examples, logic flow 800 at block 806 may cause an internal activation of all CSLs to the block of memory by the memory device, the internal activation of all CSLs to cause the GIO value of 0 to be written to a first portion of the block of memory before a write line is internally activated by the memory device. For these examples, the write 0 command forwarded by write0 logic 722-2 may automatically cause the internal activation of all CSLs to the block of memory by the memory device.

FIG. 9 illustrates an example of a logic flow 900. Logic flow 900 may be representative of some or all of the operations executed by one or more logic, features, or devices described herein, such as apparatus 700. More particularly, logic flow 900 may be implemented by one or more of write0 logic 722-1 or count logic 722-2.

According to some examples, logic flow 900 at block 902 may forward, at a controller for a memory device, a write 0 command to cause one or more blocks of memory for the memory device to store a value of 0. For these examples, write0 logic 722-1 may forward the write 0 command.

In some examples, logic flow 900 at block 904 may cause internal activation of CSLs to the one or more blocks of memory by the memory device, the internal activation of the CSLs to occur in a sequential manner until all columns of the one or more blocks of memory have been activated and the one or more blocks of memory store the value of 0. For these examples, the write 0 command forwarded by write0 logic 722-2 may automatically cause the internal activation of CSLs to the one or more blocks of memory by the memory device.

Figure 10:
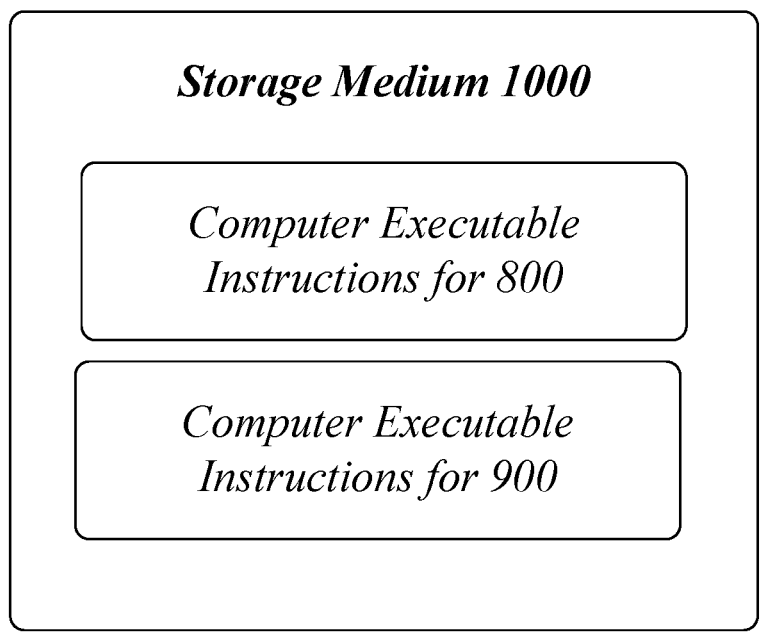
FIG. 10 illustrates an example of a storage medium.

FIG. 10 illustrates an example of a first storage medium. As shown in FIG. 10, the first storage medium includes a storage medium 1000. The storage medium 1000 may comprise an article of manufacture. In some examples, storage medium 1000 may include any non-transitory computer readable medium or machine readable medium, such as an optical, magnetic or semiconductor storage. Storage medium 1000 may store various types of computer executable instructions, such as instructions to implement logic flow 800 or logic flow 900. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 11:
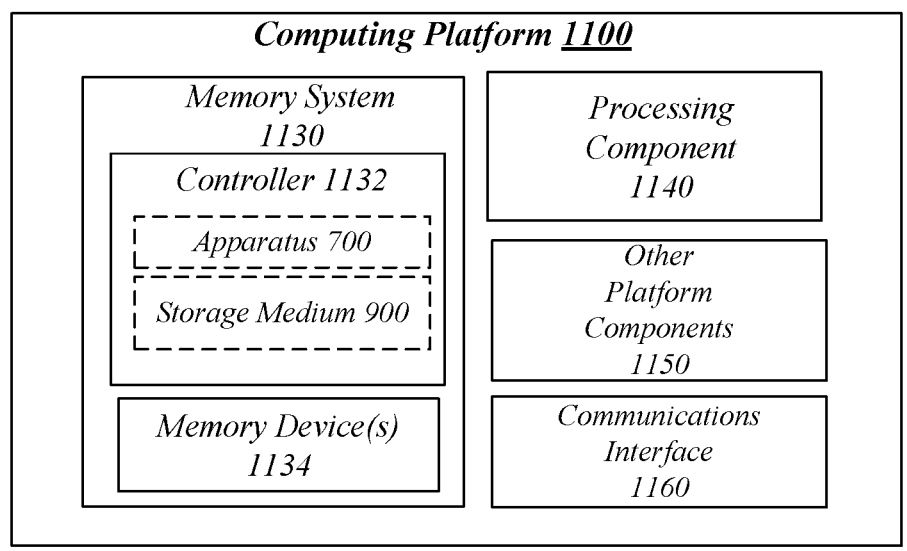
FIG. 11 illustrates an example computing platform.

FIG. 11 illustrates an example computing platform 1100. In some examples, as shown in FIG. 11, computing platform 1100 may include a memory system 1130, a processing component 1140, other platform components 1150 or a communications interface 1160. According to some examples, computing platform 1100 may be implemented in a computing device.

According to some examples, memory system 1130 may include a controller 1132 and memory devices(s) 1134. For these examples, logic and/or features resident at or located at controller 1132 may execute at least some processing operations or logic for apparatus 700 and may include storage media that includes storage medium 1000. Also, memory device(s) 1134 may include similar types of volatile or non-volatile memory (not shown) that are described above for memory array 100, system 200 or system 500 shown in FIGS. 1, 2 and 5. In some examples, controller 1132 may be part of a same die with memory device(s) 1134. In other examples, controller 1132 and memory device(s) 1134 may be located on a same die or integrated circuit with a processor (e.g., included in processing component 1140). In yet other examples, controller 1132 may be in a separate die or integrated circuit coupled with memory device(s) 1134.

According to some examples, processing component 1140 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/ programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1150 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1150 or storage system 1130 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1160 may include logic and/or features to support a communication interface. For these examples, communications interface 1160 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1100 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1100 described herein, may be included or omitted in various embodiments of computing platform 1100, as suitably desired.

The components and features of computing platform 1100 may be implemented using any combination of discrete circuitry, ASICs, logic gates and/or single chip architectures. Further, the features of computing platform 1100 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include a controller for a memory device that includes logic, at least a portion of which may include hardware. For these examples, the logic may forward a write 0 command to cause all bit values in a block of memory of the memory device to have a value of 0. The logic may also cause all GIOs to the block of memory to have a GIO value of 0. The logic may also cause an internal activation of all CSLs to the block of memory by the memory device. The internal activation of all CSLs may cause the GIO value of 0 to be written to a first portion of the block of memory before a write line is internally activated by the memory device.

Example 2

The apparatus of example 1, the logic may also cause all/GIOs to the block of memory to have value of 1 such that the internal activation of all CSLs to the block of memory cause the/GIO value of 1 to be written to a second portion of the block of memory before the write line is internally activated by the memory device.

Example 3

The apparatus of example 1, the block of memory may be a bank of the memory device.

Example 4

The apparatus of example 1, the memory device may include non-volatile memory or volatile memory. For these examples, the volatile memory may include DRAM and the non-volatile memory may include 3-D cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 5

The apparatus of example 1 may also include one or more of: one or more processors coupled to the controller; a network interface communicatively coupled to the apparatus; a battery coupled to the apparatus; or a display communicatively coupled to the apparatus.

Example 6

An example method may include forwarding, at a controller for a memory device, a write 0 command to cause all bit values in a block of memory of the memory device to have a value of 0. The method may also include causing all GIOs to the block of memory to have a GIO value of 0. The method may also include causing an internal activation of all CSLs to the block of memory by the memory device. The internal activation of all CSLs may cause the GIO value of 0 to be written to a first portion of the block of memory before a write line is internally activated by the memory device.

Example 7

The method of example 6 may also include causing all/GIOs to the block of memory to have value of 1 such that the internal activation of all CSLs to the block of memory cause the/GIO value of 1 to be written to a second portion of the block of memory before the write line is internally activated by the memory device.

Example 8

The method of example 6, the block of memory may be a bank of the memory device.

Example 9

The method of example 6, the memory device may include non-volatile memory or volatile memory. For these examples, the volatile memory may include DRAM and the non-volatile memory may include 3-D cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 10

An example at least one machine readable medium may include a plurality of instructions that in response to being executed by a system may cause the system to carry out a method according to any one of examples 6 to 9.

Example 11

An example apparatus may include means for performing the methods of any one of examples 6 to 9.

Example 12

An example system may include a memory device. The example system may also include a controller that includes logic, at least a portion of which may include hardware. For these examples, the logic may forward a write 0 command to cause all bit values in a block of memory of the memory device to have a value of 0. The logic may also cause all GIOs to the block of memory to have a GIO value of 0. The logic may also cause an internal activation of all CSLs to the block of memory by the memory device. The internal activation of all CSLs may cause the GIO value of 0 to be written to a first portion of the block of memory before a write line is internally activated by the memory device.

Example 13

The system of example 12 may also include the logic to cause all/GIOs to the block of memory to have value of 1 such that the internal activation of all CSLs to the block of memory cause the/GIO value of 1 to be written to a second portion of the block of memory before the write line is internally activated by the memory device.

Example 14

The system of example 12, the block of memory may be a bank of the memory device.

Example 15

The system of example 12, the memory device may include non-volatile memory or volatile memory. For these examples, the volatile memory may include DRAM and the non-volatile memory may include 3-D cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 16

An example apparatus may include a controller for a memory device that includes logic, at least a portion of which may include hardware. For these examples, the logic may forward a write 0 command to cause one or more blocks of memory for the memory device to store a value of 0. The logic may also cause internal activation of CSLs to the one or more blocks of memory by the memory device. The internal activation of the CSLs may occur in a sequential manner until all columns of the one or more blocks of memory have been activated and the one or more blocks of memory store the value of 0.

Example 17

The apparatus of example 16, the logic may cause the internal activation of CSLs to occur in the sequential manner based on use of a column count of the internally activated CSLs by the memory device.

Example 18

The apparatus of example 17, use of the column count to cause the internal activation of CSLs to occur in the sequential manner may include the column count to cause sequential internal activation of CSLs to occur such that at least two CSLs are activated per iteration of the sequential internal activation of CSLs until all columns of the one or more blocks of memory have been activated and the one or more blocks of memory store the value of 0.

Example 19

The apparatus of example 17, the one or more blocks of memory may include a first block of memory and a second block of memory.

Example 20

The apparatus of example 19, the column count of the internally activated CSLs may be based on a first column count to cause internal activation of CSLs to the first block of memory in the sequential manner until all columns of the first block of memory have been activated and the first block of memory stores the value of 0. The column count of the internally activated CSLs may also be based on a second column count. The second count initiated after all columns of the first block of memory have been activated, to cause internal activation of CSLs to the second block of memory in the sequential manner until all columns of the second block of memory have been activated and the second block of memory stores the value of 0.

Example 21

The apparatus of example 18, the column count to cause internal activation of CSLs to the first and second blocks of memory by the memory device in the sequential manner such that columns of the first and second blocks of memory are activated substantially simultaneously in the sequential manner until all columns of the first and second blocks of memory have been activated and the first and second blocks of memory store the value of 0.

Example 22

The apparatus of example 21, use of the column count to cause the internal activation of CSLs such that columns of the first and second blocks of memory are activated substantially simultaneously in the sequential manner further comprises sequential internal activation of CSLs to occur at the first and second blocks of memory such that at least two CSLs are activated substantially simultaneously at the first block of memory with at least two CSLs at the second block of memory per iteration of the sequential internal activation of CSLs.

Example 23

The apparatus of example 16, the one or more block of memory may be one or more banks of the memory device.

Example 24

The apparatus of example 16, the memory device may include non-volatile memory or volatile memory. For these examples, the volatile memory may include DRAM and the non-volatile memory may include 3-D cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 25

The apparatus of example 16 may include one or more of: one or more processors coupled to the controller; a network interface communicatively coupled to the apparatus; a battery coupled to the apparatus; or a display communicatively coupled to the apparatus.

Example 26

An example method may include forwarding, at a controller for a memory device, a write 0 command to cause one or more blocks of memory for the memory device to store a value of 0. The method may also include causing internal activation of CSLs to the one or more blocks of memory by the memory device. The internal activation of the CSLs may occur in a sequential manner until all columns of the one or more blocks of memory have been activated and the one or more blocks of memory store the value of 0.

Example 27

The method of example 26, causing the internal activation of CSLs to occur in the sequential manner may be based on use of a column count of the internally activated CSLs by the memory device.

Example 28

The method of example 27, use of the column count to cause the internal activation of CSLs to occur in the sequential manner may include the column count causing sequential internal activation of CSLs to occur such that at least two CSLs are activated per iteration of the sequential internal activation of CSLs until all columns of the one or more blocks of memory have been activated and the one or more blocks of memory store the value of 0.

Example 29

The method of example 27, the one or more blocks of memory may include a first block of memory and a second block of memory.

Example 30

The method of example 29, the column count of the internally activated CSLs may be based on a first column count to cause internal activation of CSLs to the first block of memory in the sequential manner until all columns of the first block of memory have been activated and the first block of memory stores the value of 0. The column count of the internally activated CSLs may also be based on a second column count, initiated after all columns of the first block of memory have been activated, to cause internal activation of CSLs to the second block of memory in the sequential manner until all columns of the second block of memory have been activated and the second block of memory stores the value of 0.

Example 31

The method of example 28, the column count may cause internal activation of CSLs to the first and second blocks of memory by the memory device in the sequential manner such that columns of the first and second blocks of memory are activated substantially simultaneously in the sequential manner until all columns of the first and second blocks of memory have been activated and the first and second blocks of memory store the value of 0.

Example 32

The method of example 31, use of the column count to cause the internal activation of CSLs such that columns of the first and second blocks of memory are activated substantially simultaneously in the sequential manner further may include sequential internal activation of CSLs to occur at the first and second blocks of memory such that at least two CSLs are activated substantially simultaneously at the first block of memory with at least two CSLs at the second block of memory per iteration of the sequential internal activation of CSLs.

Example 33

The method of example 26, the one or more block of memory may be one or more banks of the memory device.

Example 34

The method of example 26, the memory device may include non-volatile memory or volatile memory. For these examples, the volatile memory may include DRAM and the non-volatile memory may include 3-D cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

Example 35

An example at least one machine readable medium may include a plurality of instructions that in response to being executed by a system may cause the system to carry out a method according to any one of examples 26 to 34.

Example 36

An example apparatus may include means for performing the methods of any one of examples 26 to 34.

Example 37

An example system may include a memory device. The system may also include a controller that includes logic, at least a portion of which may be hardware. For these examples, the logic may forward a write 0 command to cause one or more blocks of memory for the memory device to store a value of 0. The logic may also cause internal activation of CSLs to the one or more blocks of memory by the memory device. The internal activation of the CSLs may occur in a sequential manner until all columns of the one or more blocks of memory have been activated and the one or more blocks of memory store the value of 0.

Example 38

The system of example 37, the logic may cause the internal activation of CSLs to occur in the sequential manner based on use of a column count of the internally activated CSLs by the memory device.

Example 39

The system of example 38, use of the column count to cause the internal activation of CSLs to occur in the sequential manner may include the column count to cause sequential internal activation of CSLs to occur such that at least two CSLs are activated per iteration of the sequential internal activation of CSLs until all columns of the one or more blocks of memory have been activated and the one or more blocks of memory store the value of 0.

Example 40

The system of example 38, the one or more blocks of memory may include a first block of memory and a second block of memory.

Example 41

The system of example 40, the column count of the internally activated CSLs may be based on a first column count to cause internal activation of CSLs to the first block of memory in the sequential manner until all columns of the first block of memory have been activated and the first block of memory stores the value of 0. The column count of the internally activated CSLs may also be based on a second column count, initiated after all columns of the first block of memory have been activated, to cause internal activation of CSLs to the second block of memory in the sequential manner until all columns of the second block of memory have been activated and the second block of memory stores the value of 0.

Example 42

The system of example 41, the column count may cause internal activation of CSLs to the first and second blocks of memory by the memory device in the sequential manner such that columns of the first and second blocks of memory are activated substantially simultaneously in the sequential manner until all columns of the first and second blocks of memory have been activated and the first and second blocks of memory store the value of 0.

Example 43

The system of example 42, use of the column count to cause the internal activation of CSLs such that columns of the first and second blocks of memory are activated substantially simultaneously in the sequential manner further includes sequential internal activation of CSLs to occur at the first and second blocks of memory such that at least two CSLs are activated substantially simultaneously at the first block of memory with at least two CSLs at the second block of memory per iteration of the sequential internal activation of CSLs.

Example 44

The system of example 37, the one or more block of memory may be one or more banks of the memory device.

Example 45

The system of example 37, the memory device may include non-volatile memory or volatile memory. For these examples, the volatile memory may include DRAM and the non-volatile memory may include 3-D cross-point memory, memory that uses chalcogenide phase change material, multi-threshold level NAND flash memory, NOR flash memory, single or multi-level PCM, resistive memory, ovonic memory, nanowire memory, FeTRAM, MRAM memory that incorporates memristor technology, or STT-MRAM.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
    a controller for a memory device that includes logic, at least a portion of which comprises hardware, the logic to:
        forward a write 0 command to cause all bit values in a block of memory of the memory device to have a value of 0;
        cause all global input/output (GIOs) to the block of memory to have a GIO value of 0; and
        cause an internal activation of all column select lines (CSLs) to the block of memory by the memory device, the internal activation of all CSLs to cause the GIO value of 0 to be written to a first portion of the block of memory before a write line is internally activated by the memory device.

2. The apparatus of claim 1, further comprising the logic to:
    cause all/GIOs to the block of memory to have value of 1 such that the internal activation of all CSLs to the block of memory cause the/GIO value of 1 to be written to a second portion of the block of memory before the write line is internally activated by the memory device.

3. The apparatus of claim 1, the block of memory comprises a bank of the memory device.

4. The apparatus of claim 1, comprising the memory device to include non-volatile memory or volatile memory, wherein the volatile memory includes dynamic random access memory (DRAM) and the non-volatile memory includes 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

5. The apparatus of claim 1, comprising one or more of:
    one or more processors coupled to the controller;
    a network interface communicatively coupled to the apparatus;
    a battery coupled to the apparatus; or
    a display communicatively coupled to the apparatus.

6. A method comprising:
    forwarding, at a controller for a memory device, a write 0 command to cause all bit values in a block of memory of the memory device to have a value of 0;
    causing all global input/output (GIOs) to the block of memory to have a GIO value of 0; and
    causing an internal activation of all column select lines (CSLs) to the block of memory by the memory device, the internal activation of all CSLs to cause the GIO value of 0 to be written to a first portion of the block of memory before a write line is internally activated by the memory device.

7. The method of claim 6, comprising:
    causing all/GIOs to the block of memory to have value of 1 such that the internal activation of all CSLs to the block of memory cause the/GIO value of 1 to be written to a second portion of the block of memory before the write line is internally activated by the memory device.

8. The method of claim 6, the block of memory comprising a bank of the memory device.

9. An apparatus comprising:
    a controller for a memory device that includes logic, at least a portion of which comprises hardware, the logic to:
        forward a write 0 command to cause one or more blocks of memory for the memory device to store a value of 0; and
        cause internal activation of column select lines (CSLs) to the one or more blocks of memory by the memory device, the internal activation of the CSLs to occur in a sequential manner until all columns of the one or more blocks of memory have been activated and the one or more blocks of memory store the value of 0.

10. The apparatus of claim 9, comprising the logic to cause the internal activation of CSLs to occur in the sequential manner based on use of a column count of the internally activated CSLs by the memory device.

11. The apparatus of claim 10, use of the column count to cause the internal activation of CSLs to occur in the sequential manner comprises the column count to cause sequential internal activation of CSLs to occur such that at least two CSLs are activated per iteration of the sequential internal activation of CSLs until all columns of the one or more blocks of memory have been activated and the one or more blocks of memory store the value of 0.

12. The apparatus of claim 10, comprising the one or more blocks of memory includes a first block of memory and a second block of memory.

13. The apparatus of claim 12, comprising the column count of the internally activated CSLs is based on:
a first column count to cause internal activation of CSLs to the first block of memory in the sequential manner until all columns of the first block of memory have been activated and the first block of memory stores the value of 0; and
a second column count, initiated after all columns of the first block of memory have been activated, to cause internal activation of CSLs to the second block of memory in the sequential manner until all columns of the second block of memory have been activated and the second block of memory stores the value of 0.

14. The apparatus of claim 12, comprising the column count to cause internal activation of CSLs to the first and second blocks of memory by the memory device in the sequential manner such that columns of the first and second blocks of memory are activated substantially simultaneously in the sequential manner until all columns of the first and second blocks of memory have been activated and the first and second blocks of memory store the value of 0.

15. The apparatus of claim 14, use of the column count to cause the internal activation of CSLs such that columns of the first and second blocks of memory are activated substantially simultaneously in the sequential manner further comprises sequential internal activation of CSLs to occur at the first and second blocks of memory such that at least two CSLs are activated substantially simultaneously at the first block of memory with at least two CSLs at the second block of memory per iteration of the sequential internal activation of CSLs.

16. The apparatus of claim 9, the one or more block of memory comprising one or more banks of the memory device.

17. The apparatus of claim 9, comprising the memory device to include non-volatile memory or volatile memory, wherein the volatile memory includes dynamic random access memory (DRAM) and the non-volatile memory includes 3-dimensional cross-point memory, memory that uses chalcogenide phase change material, multi-threshold level NAND flash memory, NOR flash memory, single or multi-level phase change memory (PCM), resistive memory, ovonic memory, nanowire memory, ferroelectric transistor random access memory (FeTRAM), magnetoresistive random access memory (MRAM) memory that incorporates memristor technology, or spin transfer torque MRAM (STT-MRAM).

18. The apparatus of claim 9, comprising one or more of:
one or more processors coupled to the controller;
a network interface communicatively coupled to the apparatus;
a battery coupled to the apparatus; or
a display communicatively coupled to the apparatus.

19. A method comprising:
forwarding, at a controller for a memory device, a write 0 command to cause one or more blocks of memory for the memory device to store a value of 0; and
causing internal activation of column select lines (CSLs) to the one or more blocks of memory by the memory device, the internal activation of the CSLs to occur in a sequential manner until all columns of the one or more blocks of memory have been activated and the one or more blocks of memory store the value of 0.

20. The method of claim 19, comprising causing the internal activation of CSLs to occur in the sequential manner based on use of a column count of the internally activated CSLs by the memory device.

21. The method of claim 20, use of the column count to cause the internal activation of CSLs to occur in the sequential manner comprises the column count causing sequential internal activation of CSLs to occur such that at least two CSLs are activated per iteration of the sequential internal activation of CSLs until all columns of the one or more blocks of memory have been activated and the one or more blocks of memory store the value of 0.

22. The method of claim 20, comprising the one or more blocks of memory includes a first block of memory and a second block of memory.

23. The method of claim 22, comprising the column count of the internally activated CSLs is based on:
a first column count to cause internal activation of CSLs to the first block of memory in the sequential manner until all columns of the first block of memory have been activated and the first block of memory stores the value of 0; and
a second column count, initiated after all columns of the first block of memory have been activated, to cause internal activation of CSLs to the second block of memory in the sequential manner until all columns of the second block of memory have been activated and the second block of memory stores the value of 0.

24. The method of claim 22, comprising the column count to cause internal activation of CSLs to the first and second blocks of memory by the memory device in the sequential manner such that columns of the first and second blocks of memory are activated substantially simultaneously in the sequential manner until all columns of the first and second blocks of memory have been activated and the first and second blocks of memory store the value of 0.

25. The method of claim 24, use of the column count to cause the internal activation of CSLs such that columns of the first and second blocks of memory are activated substantially simultaneously in the sequential manner further comprises sequential internal activation of CSLs to occur at the first and second blocks of memory such that at least two CSLs are activated substantially simultaneously at the first block of memory with at least two CSLs at the second block of memory per iteration of the sequential internal activation of CSLs.

* * * * *